(12) United States Patent
Otey et al.

(10) Patent No.: US 9,929,331 B2
(45) Date of Patent: Mar. 27, 2018

(54) INTEGRATED THERMOELECTRIC-POWERED FLUID HEAT EXCHANGER

(71) Applicant: Ferrotec (USA) Corporation, Santa Clara, CA (US)

(72) Inventors: Robert Otey, Trinity Center, CA (US); David A. Kaminski, Dunbarton, NH (US); Pheng Sin, Livermore, CA (US)

(73) Assignee: Ferrotec (USA) Corporation, Santa Clara, CA (US)

( * ) Notice: Subject to any disclaimer, the term of this patent is extended or adjusted under 35 U.S.C. 154(b) by 694 days.

(21) Appl. No.: 14/256,926

(22) Filed: Apr. 19, 2014

(65) Prior Publication Data

US 2014/0311541 A1    Oct. 23, 2014

Related U.S. Application Data

(60) Provisional application No. 61/813,669, filed on Apr. 19, 2013.

(51) Int. Cl.
*F25B 21/02* (2006.01)
*H01L 35/30* (2006.01)
(Continued)

(52) U.S. Cl.
CPC ............. *H01L 35/30* (2013.01); *F28D 1/024* (2013.01); *F28D 7/0008* (2013.01); *F28F 3/025* (2013.01); *F28F 5/00* (2013.01)

(58) Field of Classification Search
CPC .................................. F28F 5/00; F25B 21/02
See application file for complete search history.

(56) References Cited

U.S. PATENT DOCUMENTS 4,726,193 A * 2/1988 Burke ................ F25B 21/02
                                                    62/354
2002/0134087 A1    9/2002 Urch
(Continued)

FOREIGN PATENT DOCUMENTS

JP          07-104113 B2     11/1995
WO       2012-061777 A2      5/2012

OTHER PUBLICATIONS

PCT International Search Report and Written Opinion, PCT/US2014/056353, dated Jun. 12, 2015.

*Primary Examiner* — Sadie White
(74) *Attorney, Agent, or Firm* — Robert R. Deleault, Esq.; Mesmer & Deleault, PLLC (57) ABSTRACT

A fluid heat exchanger has an impeller assembly with first and second impeller bodies mated together, each having a substantially circular shape and at least one opening therethrough. Impeller vanes extend transversely from the first impeller body and away from the second impeller body. Impeller vanes extend transversely from the second impeller body away from the first impeller body. A thermoelectric module is disposed between the first impeller body and the second impeller body. Heat sinks are connected to each side of the thermoelectric module and extend through at least one opening in the first and second impeller bodies, where the impeller vanes are configured to move a fluid through the heat sinks during rotation of the first and second impeller bodies. Electrically-conductive windings disposed in the impeller assembly are configured to deliver induced electric current to the one or more thermoelectric modules.

13 Claims, 6 Drawing Sheets

(51) Int. Cl.
 *F28F 5/00* (2006.01)
 *F28D 7/00* (2006.01)
 *F28D 1/02* (2006.01)
 *F28F 3/02* (2006.01)

(56) References Cited

U.S. PATENT DOCUMENTS

2008/0054745 A1\* 3/2008 Sentmanat ............ A61M 1/101
 310/89
2009/0026813 A1 1/2009 Lofy
2009/0034202 A1 2/2009 Chiu et al.
2011/0259386 A1\* 10/2011 Lee ........................... F24J 2/06
 136/206

\* cited by examiner

INTEGRATED THERMOELECTRIC-POWERED FLUID HEAT EXCHANGER

BACKGROUND OF THE INVENTION

1. Field of the Invention

The present invention relates generally to thermoelectric devices and more particularly to an integrated thermoelectric-powered fluid heat exchanger.

2. Description of the Prior Art

A thermoelectric (TE) module, also called a thermoelectric cooler or Peltier cooler, is a semiconductor-based electronic component that functions as a heat pump. By applying low-voltage DC power to a TE module, heat is transferred through the module from one side to the other. One module face, therefore, is cooled while the opposite face is simultaneously heated. This phenomenon may be reversed by changing the polarity of the applied DC voltage. As a result, heat is transferred in the opposite direction. Consequently, a thermoelectric module may be used for both heating and cooling, making it suitable to precisely control temperature.

In practice, a thermoelectric module generally consists of two or more elements of n-type and p-type doped semiconductor material (e.g., bismuth telluride) that are connected electrically in series and connected thermally in parallel. These thermoelectric elements and their electrical interconnects typically are mounted between two ceramic substrates. The substrates hold the overall structure together mechanically and electrically insulate the individual elements from one another and from external mounting surfaces. Thermoelectric modules have a size of up to 300×300 mm (12×12 inches) and a height or thickness of 0.5 to 5 mm (0.02 to 0.2 inches). A variety of different shapes, substrate materials, metallization patterns and mounting options are available.

Thermoelectric modules are typically used in fluid heat exchangers as a stationary device where heat sinks or separate thermal transport devices are situated with the thermoelectric module. A blower, fan, pump, or the like provides a fluid supply stream used in transferring heat between the heat sinks and the fluids.

In a typical configuration, power is supplied to a thermoelectric module from a separate power source. In rotating devices where hard wiring is not possible due to rotation, power is commonly supplied through commutators or slip rings in contact with rotating conductors. Rotating conductors (either slip rings or commutator segments) are added to the rotating shaft and include stationary carbon brushes to transfer the power. In other variations, the brushes rotate in contact with stationary conductors.

SUMMARY OF THE INVENTION

The above-described configurations have problems and deficiencies upon which the present invention improves. A typical configuration with a thermoelectric module includes many parts, is constrained by size, and is limited by the availability of fluid supplies.

In traditional rotating devices, where power is supplied to the rotating device by commutators or slip rings, the rotation speed is limited due to heat from friction. Also, rotation causes wear to contacts and requires maintenance, such as checking for wear and or replacing brushes. Cleanliness and contamination is also a problem due to particles generated by friction between moving parts.

Therefore, what is needed is a fluid heat exchanger that reduces or eliminates moving electrical connectors and reduces contamination to the surroundings.

It is an object of the present invention to integrate a thermoelectric heat exchanger and fluid mover in a single assembly.

It is another object of the present invention to improve the reliability of fluid heat exchangers.

It is another object of the present invention to deliver induced electric power to a thermoelectric module.

The present invention achieves these and other objectives by providing a single assembly that integrates a thermoelectric module, heat sinks, and a fluid mover or impeller. In one embodiment of the present invention, a fluid heat exchanger has an impeller assembly that includes first and second impeller bodies, each having a substantially circular shape and a plurality of openings therethrough. The second impeller body is disposed substantially parallel and connected to the first impeller body. Impeller vanes extend transversely from the first impeller body and away from the second impeller body. Impeller vanes extend transversely from the second impeller body away from the first impeller body. A thermoelectric module with a first substrate and a second substrate is disposed between the first impeller body and the second impeller body. Electrically-conductive windings disposed in the impeller assembly are configured to deliver induced electric current to the one or more thermoelectric modules. Heat sinks connected to the first substrate and to the second substrate and extend through respective openings in the first and second impeller bodies, where the impeller vanes are configured to move a fluid through the heat sinks during rotation of the first and second impeller bodies.

DETAILED DESCRIPTION OF THE PREFERRED EMBODIMENT

Figure 1:
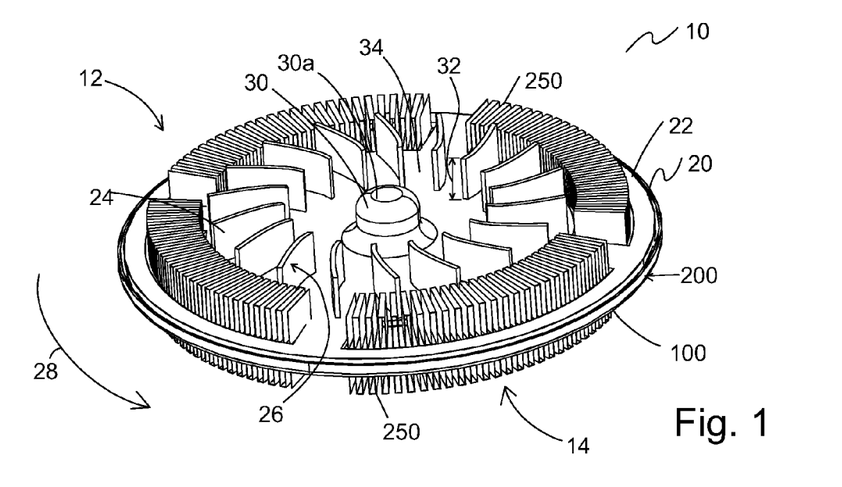
FIG. 1 is a perspective view of one embodiment of a fluid heat exchanger of the present invention showing a first side.

The preferred embodiments of the present invention are illustrated in FIGS. 1-11. FIG. 1 illustrates a perspective view of one embodiment of a fluid heat exchanger 10 of the present invention. Fluid heat exchanger 10 includes a fluid mover assembly or impeller assembly 20 and a thermoelectric module 200 (shown in FIG. 6) with a plurality of heat sinks 250. This embodiment integrates thermoelectric module 200, impeller assembly 20, and heat sinks 250 as a single assembled unit that is configured to rotate on a shaft (not shown) that extends into or through an aperture 30*a* in hub 30.

Figure 6:
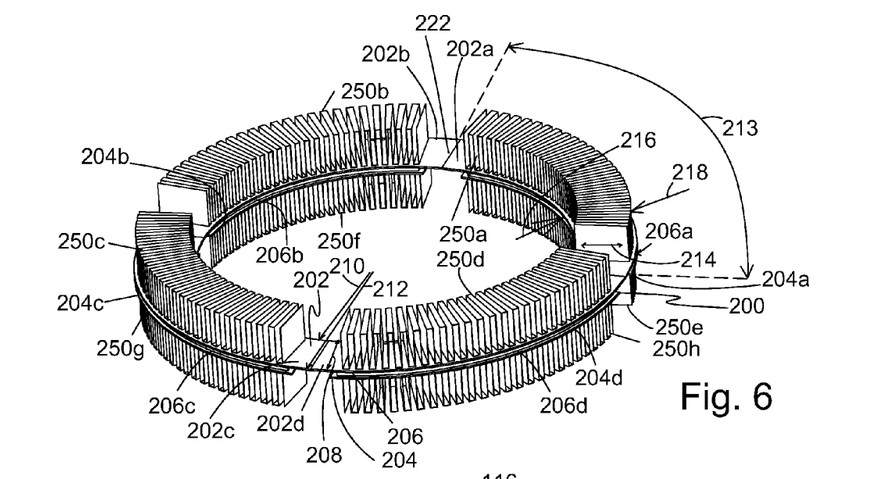
FIG. 6 is a perspective view of a thermoelectric module with heat sinks of the present invention shown as part of an exploded assembly.

One or more thermoelectric module(s) 200 is (are) sandwiched between a first impeller body 22 and a second impeller body 100. A plurality of heat sinks 250 are attached to or formed integrally with each thermoelectric module 200, preferably with at least one heat sink 250 on a first side 202 and on a second side 204 of thermoelectric module 200 (shown in FIG. 4 and discussed below).

First impeller body 22 has a plurality of first impeller vanes 24 attached to or extending from first impeller body in a substantially perpendicular direction. In one embodiment, first impeller body 22 has eighteen first impeller vanes 24. Other quantities may be selected as appropriate for the desired fluid flow and heat transfer effect. In one embodiment, each impeller vane 24 has a concave face 26 that preferably faces in the direction of rotation 28 to more efficiently move a fluid, such as air, through or across heat sink(s) 250. In one embodiment, first impeller vanes 24 have a height 32 that exceeds that of heat sink(s) 250 beyond a planar surface 34 of first impeller body 22.

Figure 2:
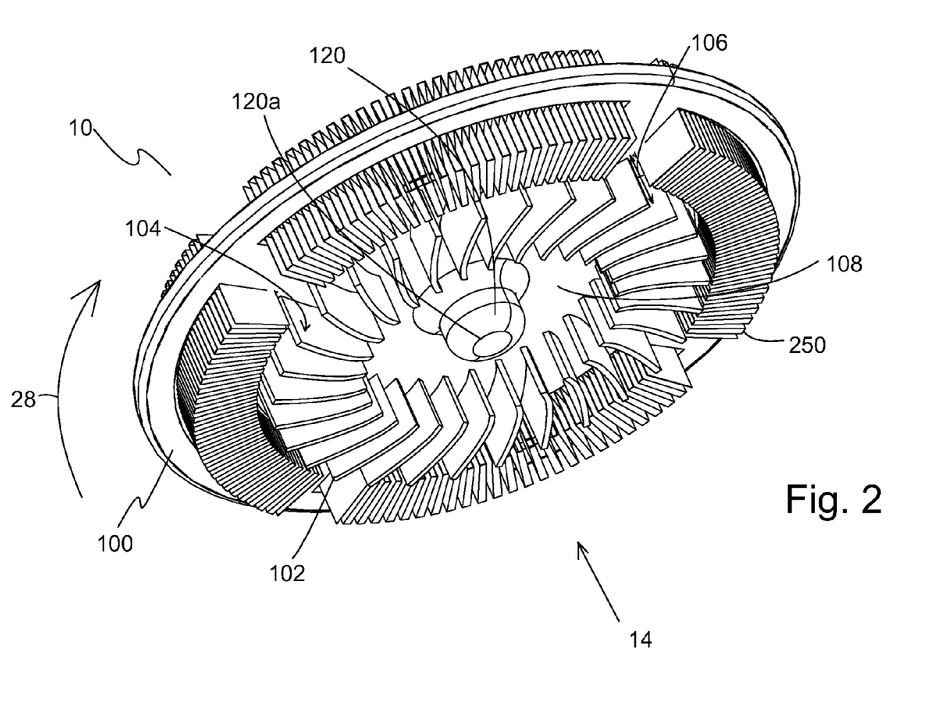
FIG. 2 is a perspective view of the fluid heat exchanger of FIG. 1 showing a second side.

Referring now to FIG. 2, a perspective view illustrates one embodiment of a second side 14 of fluid heat exchanger 10. Similar to first impeller body 22, second impeller body 100 has a plurality of second impeller vanes 102 attached to or extending from second impeller body 100 in a substantially perpendicular direction. In one embodiment, second impeller body 100 has thirty second impeller vanes 102. Other quantities may be selected as appropriate for the desired fluid flow and heat transfer effect. In one embodiment, each impeller vane 102 has a concave face 104 that preferably faces in direction of rotation 28 to more efficiently move a fluid, such as air, through or across heat sink(s) 250. In one embodiment, second impeller vanes 102 have a height 106 that exceeds that of heat sink(s) 250 beyond a planar surface 108 of second impeller body 100. In other embodiments, second impeller vanes 102 have height 106 that is the same or lesser than the height of heat sink(s) 250. Second impeller body 100 has a second hub 120 with second aperture 120*a* to receive a shaft (not shown). In some embodiments, aperture 30*a* of hub 30 is continuous with second aperture 120*a* of second hub 120. It is contemplated that first and second impeller bodies 22, 100 may have a different number of impeller vanes 22, 102 on each side or an equal number of vanes and the above-listed number of vanes is not intended to be limiting. In other embodiments, impeller vanes 24, 102 have height 32, 106, respectively, that is the same or lesser than the height of the heat sink(s) 250. It is also understood that the impeller vane may have any shape so long as it transverse to the impeller body and provides air movement across heat sinks 250. It is further understood that the impeller vanes may vary in height.

Figure 3:
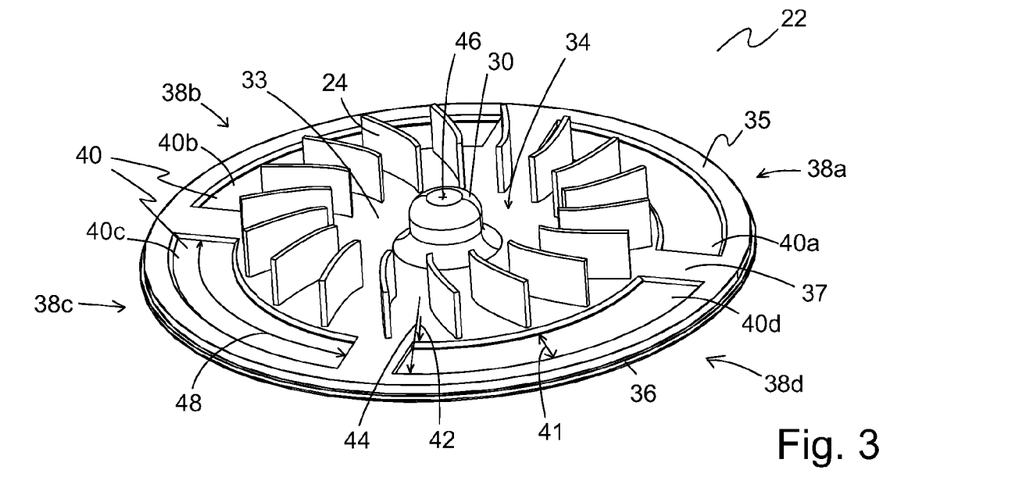
FIG. 3 is a perspective view of a impeller body of the present invention showing an outside surface with impeller vanes.

Referring now to FIG. 3, there is illustrated a top, perspective view of first impeller body 22 with hub 30 and first impeller vanes 24. First impeller body 22 is generally planar with an outside surface 34. First impeller body 22 has an inner region 33 of generally circular shape connected to an outer ring 35 by bridge segments 37 extending radially between inner region 33 and outer ring 35. Outer ring 35 has an overhanging first impeller perimeter rim 36 that extends in a direction (e.g., downward) opposite of first impeller vanes 24 (e.g., upward). First impeller body 22 has a plurality of first body openings 40, preferably arc-shaped, and bounded by first inner region 33, first bridge segments 37, and first outer ring 35. It is contemplated that bridge segments 37 may be narrower or wider than shown relative to the openings 40, or may be eliminated entirely with modification to the mating of first and second impeller bodies 22, 102.

In one embodiment, first impeller body 22 has four openings 40*a*-40*d* with one first body opening 40 disposed in each of four quadrants 38*a*-38*d* of planar surface 34, with even angular spacing between four bridge segments 37. Each of openings 40*a*-40*d* preferably extends between a first radius 42 and a second radius 44 from center 46 of outside surface 34 and has an arc width 48 of about eighty degrees. Openings 40*a*-40*d* are sized and configured to allow heat sinks 250 to extend therethrough. In other embodiments, more or fewer first body openings 40 may be used, such as a plurality of substantially square or rectangular first body openings 40 evenly spaced around first impeller body 22 for receiving substantially square or rectangular thermoelectric modules 200.

Figure 4:
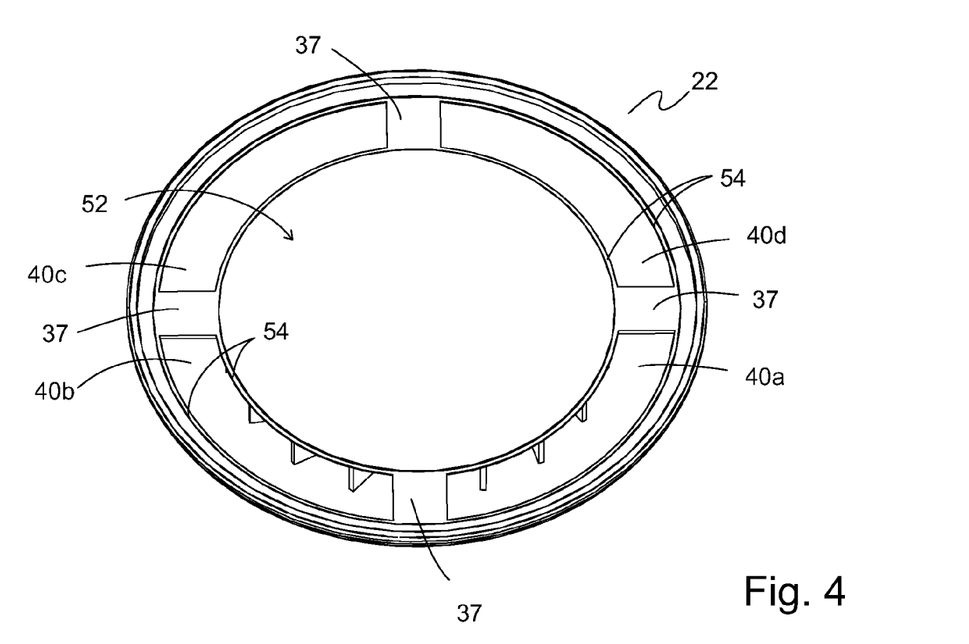
FIG. 4 is a perspective view of the impeller body of FIG. 3 showing an inside surface.

Referring now to FIG. 4, a perspective view is shown of inside surface 52 of first impeller body 22. A ring-shaped first substrate recess 54 is disposed on inside surface 52 and enclosing openings 40*a*-40*d* and bridge segments 37. First substrate recess 54 is sized and configured to receive first substrate 202 of thermoelectric module 200, which is discussed below with reference to FIG. 6. Inside surface 52 optionally includes one or more additional features useful for attaching first impeller body 22 to second impeller body 100. These additional features include, for example, a locking ring, fastener openings, fastener posts, standoff posts or members, and structures known in the art for snap-fit engagement between first impeller body 22 and second impeller body 100. These optional features may similarly be included on inside surface 110 of second impeller body 100, which is discussed below. Standoff posts or members may be strategically placed to provide additional strength to the thermoelectric module 200.

Figure 5:
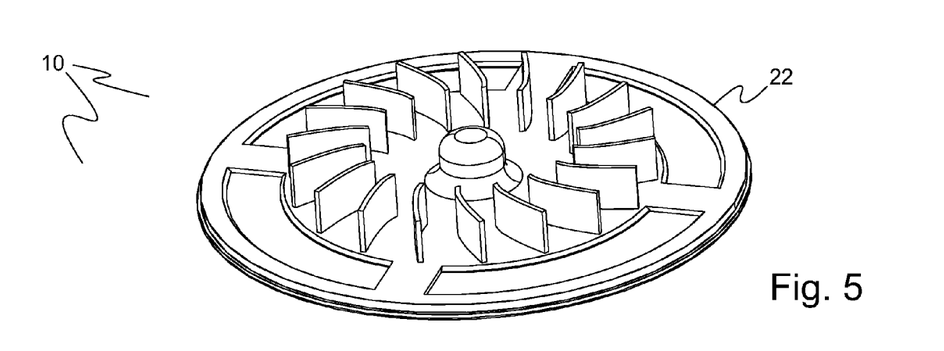
FIG. 5 is a perspective view of the impeller body of FIG. 3 shown as part of an exploded assembly with a thermoelectric module and second impeller body.
Figure 7:
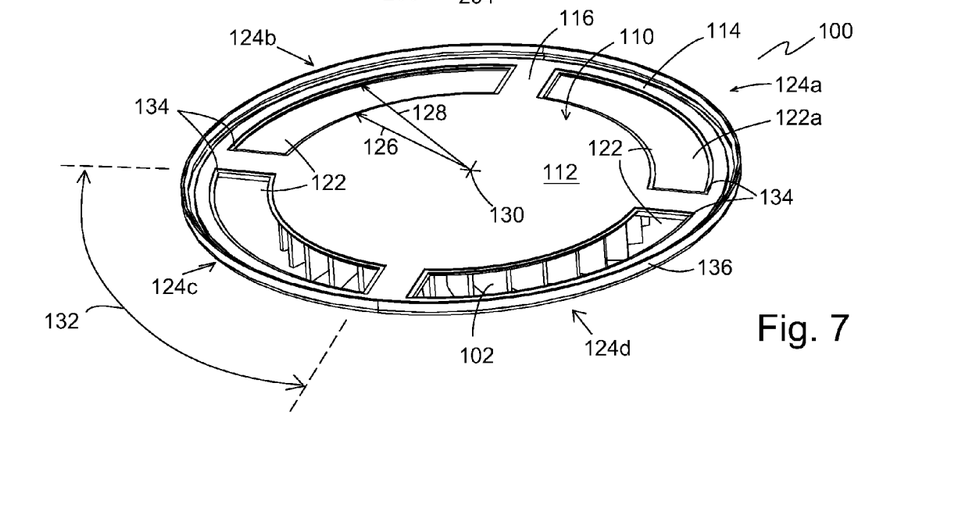
FIG. 7 is a perspective view of a second impeller body of the present invention showing an inside surface and as part of an exploded assembly.

FIGS. 5, 6, and 7 as a group illustrate an exploded, perspective view of components of fluid heat exchanger 10 with first impeller body 22, thermoelectric module 200 with heat sinks 250, and second impeller body 100. First impeller body 22 was discussed above.

Referring now to FIG. 6, a perspective view shows one embodiment of thermoelectric module 200 with heat sinks 250. The assembly of four thermoelectric modules 200 forms a substantially annular shape with a semiconductor layer 206 disposed between a first substrate 202 and a second substrate 204 of each thermoelectric module 200. In other words, each thermoelectric module 200 defines an arc. Semiconductor layer 206 comprises a plurality of n-type and p-type semiconducting materials that are electrically connected in series. For example, adjacent n-type and p-type materials are connected with copper connectors and forming a planar array of n-p and p-n junctions. First substrate 202 and second substrate 204 each connect to opposite sides of semiconducting layer 206 to structurally hold together the plurality of n-p and p-n junctions. First substrate 202 and second substrate 204 also transfer heat from semiconducting layer 206 to heat sinks 250. First substrate 202 and second substrate 204 preferably are made of electrically-insulating materials and, preferably thermally conductive materials, such as a ceramic, epoxy, polyimide, etc. As illustrated, there is a space 222 between the heat sinks 250 coinciding with the bridge elements 37. Space 222 may optionally include blocking members (not shown) to block the flow of air through space 222. An advantage of including optional blocking members in space 222 would be to cause all air flow to be conditioned.

First substrate 202 includes four arc-shaped portions 202a-202d. Second substrate 204 includes four distinct arc-shaped portions 204a-204d that are shorter in length compared to arc-shaped portions 202a-202d in this embodiment to provide space for electrical connections. More or fewer portions may be used in each of first substrate 202 and second substrate 204. Like second substrate 204, semiconducting layer 206 has four distinct regions or portions 206a-206d disposed between substrates 202a & 204a, 202b & 204b, 202c & 204c, 202d & 204d, respectively.

In one embodiment, first substrate 202 and second substrate have equal radial widths 208 between a third (inner) radius 210 and a fourth (outer) radius 212. Second substrate portions 204a-204d have a substrate arc length 213 spanning about eighty degrees. Semiconducting layer portions 206a-206d each have a third radial width 214 between a fifth (inner) radius 216 and a sixth (outer) radius 218, where the fifth radius is equal to or greater than third radius 210 and sixth radius 218 is equal to or less than fourth radius 212. Portions 206a-206d of semiconducting layer 206 have a semiconducting arc length 220 equal to or less than substrate arc length 213. Accordingly, each portion 206a-206d of semiconducting layer 206 is positioned within the boundary of each portion 204a-204d of second substrate 204, respectively. It is contemplated that the substrates may be equal in size and configuration with the electrical connections recessed from the perimeters of both substrates within the thermoelectric module.

Figure 6A:
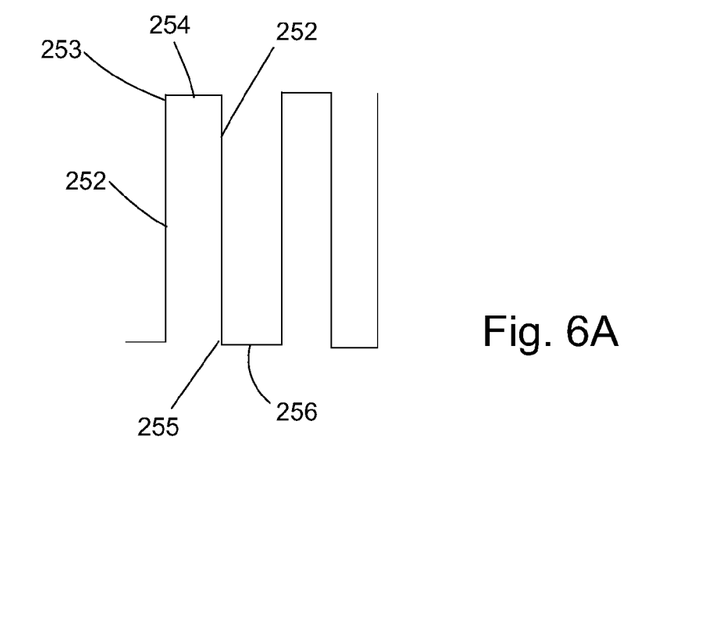
FIG. 6A is a front view of one embodiment of a heat sink.

Heat sink 250 has four heat sink portions 250a-250d, one for each portion 202a-202d of first substrate 202, respectively, and an additional four heat sink portions 250e-250h on portions 204a-204d of second substrate 204. As shown in FIG. 6A, for example, each heat sink portion 250a-250h of heat sink 250 in one embodiment is a folded metal strip substantially having the shape of a repeating square wave with adjacent vertical portions 252 connected to a first horizontal portion 254 at a first end 253 and a second horizontal portion 256 at a second end 255. Other forms of heat sink(s) 250 are acceptable, such as a heat sink (not shown) having a plurality of fins or protrusions extending from a base plate and made by metal injection molding or other methods known in the art. Although shown as having planar sides, heat sink 250 may also be shaped in a curved format much like an impeller.

Heat sink(s) 250 are adhered or connected to first substrate 202 and second substrate 204 of the thermoelectric module 200 using thermally-conductive adhesives, solder, or brazing. The method used to adhere thermoelectric module(s) 200 to head exchanger(s) 250 depends on the appropriate surface of first substrate 202 and second substrate 204. For example, a copper laminate or metalized ceramic substrate may be used with soldering or brazing. Heat sink(s) 250 or other heat transfer components may also be integrally formed with or mechanically connected to first substrate 202 and/or second substrate 204.

Referring now to FIG. 7, a perspective illustration shows an inside surface view of one embodiment of second impeller body 100. Like first impeller body 22, second impeller body 100 has a second inner region 112 of generally circular shape and a second outer ring 114 connected to second inner region 112 by a plurality of second bridge segments 116. Second impeller body 22 has a plurality of second body openings 122, preferably with one opening 12 disposed in each of four quadrants 124a-124d, having even angular spacing between second bridge segments 116, and aligned with the first body openings 40 of first impeller body 22. Each second body opening 122 preferably extends between a seventh (inner) radius 126 and an eighth (outer) radius 128 from a center 130 of second impeller body 100. Seventh radius 126 and eighth radius 128 are preferably the same as first radius 42 and second radius 44, respectively, of first impeller body 22. Preferably, each second body opening 122 has a second arc width 132 spanning about eighty degrees. Second openings 122 are sized and configured to allow heat sink(s) 250, such as 250e-h, to extend therethrough. Like first impeller body 22, more or fewer second body openings 122 may be used in second impeller body 100.

Surrounding each second opening 122 is a substrate recess 134 sized to receive second substrates 204. As assembled, edges of each second substrate 204 occupy a substrate recess 134 with the attached heat sink 250 extending through second opening 122. Bridge segments 37 of first impeller body and second bridge segments 116 of second impeller body are spaced from first substrate 202 to compensate for thermal expansion of thermoelectric module 200. Recesses 134 are useful to prevent thermoelectric module 200 from rotating with respect to second impeller body 100 (and also first impeller body 22). In embodiments where second substrates 204 extend to approach but spaced from one another to compensate for thermal expansion of thermoelectric module 200 or where recesses 134 are not a structural feature of the impeller body, other structures such as clips, fasteners, or protrusions may optionally be added to prevent rotation of thermoelectric module 200 from rotating with respect to impeller assembly 20. Second impeller body 100 has a plurality of second impeller vanes 102 extending from outside surface 108 (not visible). A second hub 120 is disposed on outside surface 108, preferably at center 130 of second impeller body 100. Second outer ring 114 has a second impeller perimeter rim 136 extending in an opposite direction (e.g., upward) from impeller vanes 102 (e.g., extending downward).

Figure 8:
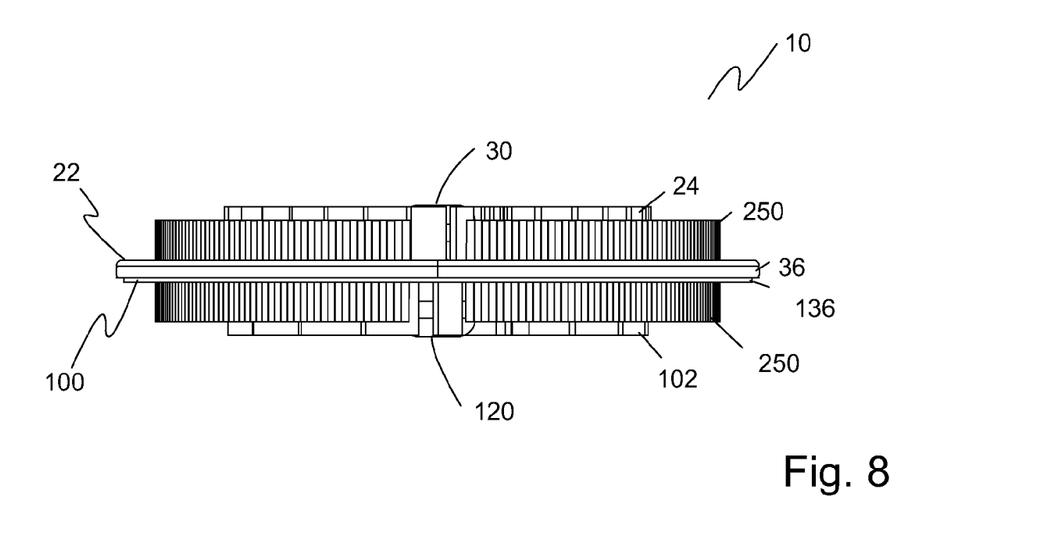
FIG. 8 is a side view of the fluid heat exchanger of FIG. 1.

Referring now to FIG. 8, a side view illustrates one embodiment of fluid heat exchanger 10. In one embodiment as illustrated, first impeller perimeter rim 36 of first impeller body 22 is shaped and configured to overlap, engage, and/or lock with second impeller perimeter rim 136 of second impeller body 100 to connect first impeller body 22 to second impeller body 100. Heat sinks 250 extend through first impeller body 22 and through second impeller body 100. First impeller vanes 24 extend from first impeller body beyond heat sink 250 and second impeller vanes 102 extend from second impeller body extend beyond heat sink 250. First hub 30 and second hub 120 extend transversely to the plane of first and second impeller bodies 2, 100 and are preferably flush with impeller vanes 24, 102, respectively.

Figure 9:
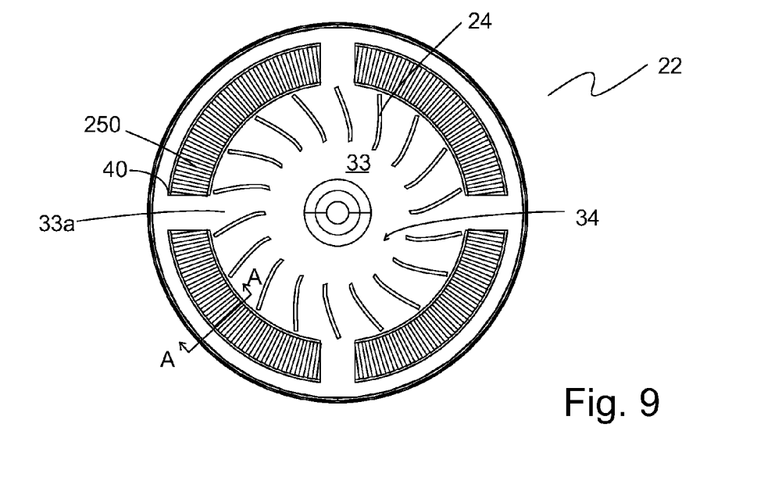
FIG. 9 is a plan view of the fluid heat exchanger of FIG. 1.

Referring now to FIG. 9, a plan view illustrates one embodiment of fluid heat exchanger 10 as viewed from a first side 12. First impeller vanes 24 extend from outside surface 34 of inner region 33 and are disposed towards a radially outward portion 33a of inner region 33, preferably proximate openings 40 and heat sinks 250.

Figure 10:
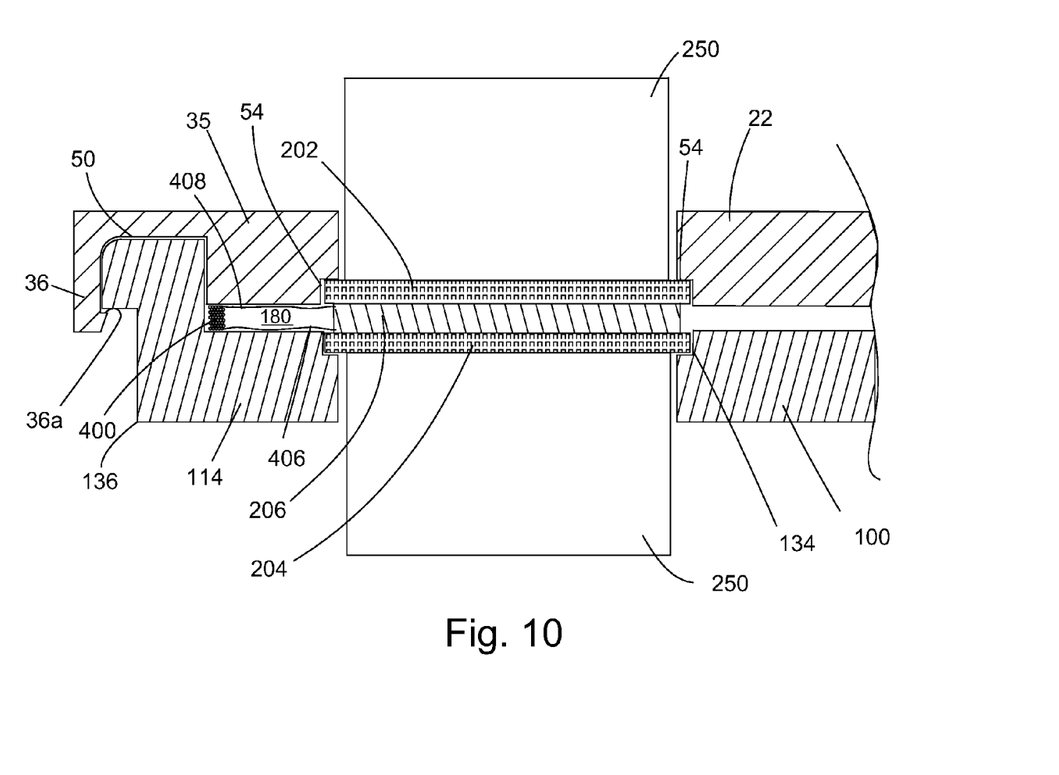
FIG. 10 is a side cross-sectional view through line A-A of FIG. 9 showing assembly of the fluid heat exchanger of FIG. 1.

Referring now to FIG. 10, a cross-sectional view taken along line A-A of FIG. 9 illustrates portions of first impeller body 22, second impeller body 100, and thermoelectric module 200 with heat sinks 250. First substrate 202 is received in first substrate recess 54 of first impeller body 22. Second substrate 204 is received in recess 134 of second impeller body 100. Semiconducting layer 206 is positioned in a gap 180 between first impeller body 22 and second impeller body 100. Perimeter rim 36 of first impeller body 22 and second perimeter rim 136 of second impeller body 100 overlap, interlock, or meet one another and are configured to define gap 180. Gap 180 preferably extends between substantial portions of first and second impeller bodies 22, 100. In one embodiment, perimeter rim 36 extends transversely (e.g., downward) from outer ring 35 of first impeller body and defines a slot or recess 50 sized to receive second perimeter rim 136. Second perimeter rim 136 extends transversely (e.g., upward) from second outer ring 114 and fits into recess 50. Optionally, first perimeter rim 36 has a catch 36a that engages second perimeter rim 136 to lock together first impeller body 22 and second impeller body 100.

The induced power is generated by induced current through current carrying conductors or wire windings 400 in gap 180 between first impeller body 22 and second impeller body 100. In one embodiment, wire windings 400 are disposed in outer ring 35 of first impeller body and or second outer ring 114 of second impeller body. Electrical connections 406, 408 are made to thermoelectric module 200 by passing conductors through gap 180 between first impeller body 22 and second impeller body 100. A magnetic field is supplied by pole pieces 402 (shown in FIG. 11), which are discussed below with reference to FIG. 11.

Figure 11:
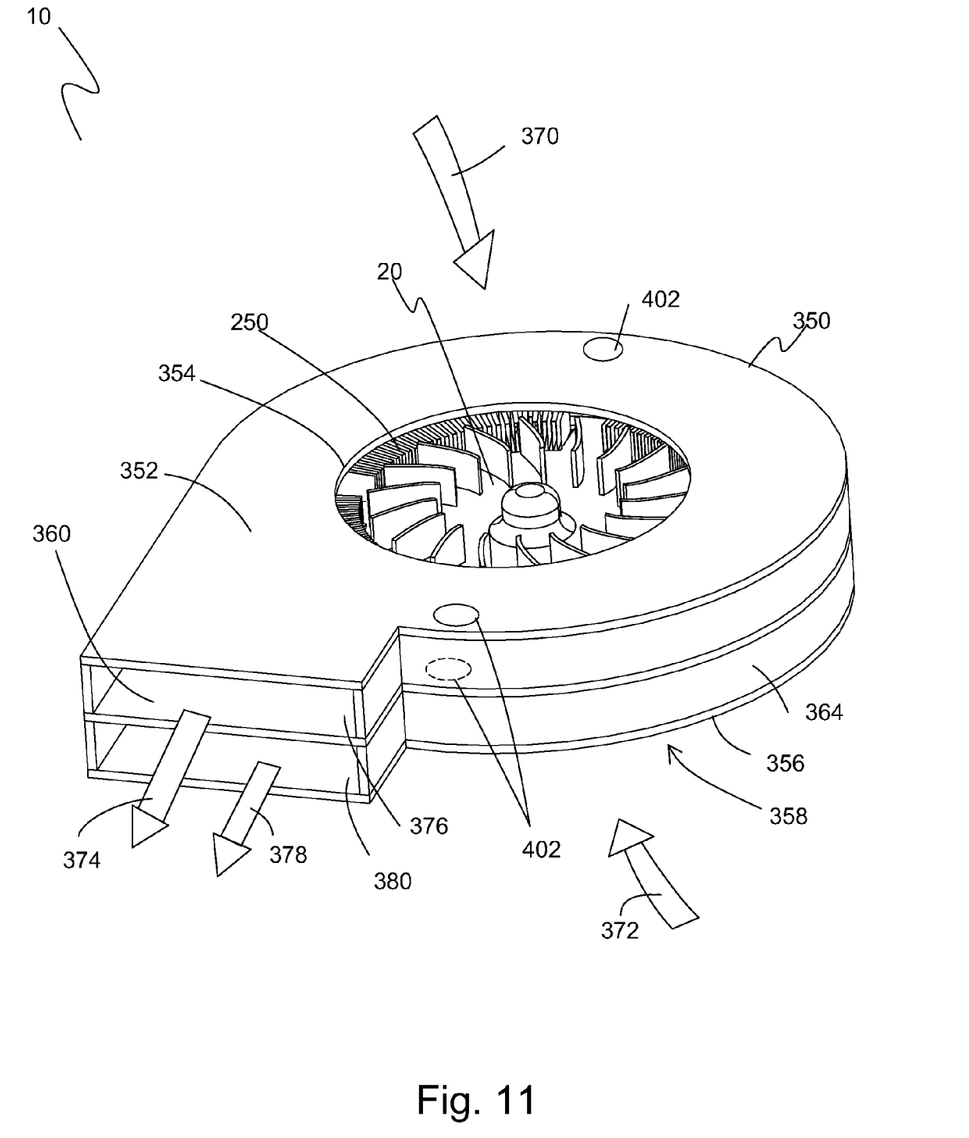
FIG. 11 is a perspective view of the fluid heat exchanger of the present invention shown within a housing.

Referring now to FIG. 11, there is illustrated fluid heat exchanger 10 within a housing 350. Housing 350 has a first side panel 352 with first side panel opening 354, a second side panel 356 with second side panel opening 358 (not visible), a flow divider panel 360 with divider opening 362 (not visible), and a sidewall 364 extending between and connecting first side panel 352, second side panel 356, and flow divider panel 360. Flow divider panel 360 is preferably aligned with perimeter rim 36 (shown in FIG. 3) and second perimeter rim 136 (shown in FIG. 7) to separate first fluid stream 370 (e.g., cooled fluid) and second fluid stream 372 (e.g., warmed fluid). Preferably, divider opening 362 is sized just larger than impeller assembly 20 to minimize mixing of first fluid stream 370 and second fluid stream 372.

In another embodiment (not shown), housing 350 has a first portion that includes first side panel and part of sidewall 364 and a second portion that includes second side panel 356 with a second part of sidewall 364. First portion and second portion join together along mating portions of sidewall 364 and define a slot or groove to receive flow divider panel 360.

Housing 350 is designed to allow a first fluid stream 370 to be taken in through first side panel opening 354 and a second fluid stream 372 to be taken in through second side panel opening 358. Each side of impeller assembly 20 creates a differential pressure that results in fluid moving across heat sinks 250 and flowing as a first exhaust stream 374 through first outlet 376 and as a second exhaust stream 378 through second outlet 380. Thus, fluid heat exchanger 10 is suitable for cooling sensitive electronic enclosures, computer boxes, cooler bins, refrigerator boxes, cabinets, or hermetically sealed or clean systems. Fluid heat exchanger 10 may also be used to direct a conditioned fluid source (e.g., first flow stream 370) to a load while diverting waste heat away from the load. This device is also suitable for use as an integral part of a closed loop heat exchanger system. When thermoelectric module 200 is powered, the fluid moving across the heat sinks is either heated or cooled depending on the polarity of the supplied voltage.

In another embodiment, heat sinks 250 are configured as impeller vanes 24 and/or 102 or are connected to impeller vanes 24 and/or 102 to increase heat transfer. Using heat sinks 250 as impeller vanes reduces the pressure drop and efficiency losses associated with standard thermoelectric devices with heat sinks. The result is that more fluid flows to the intended recipient. Impeller assembly 20 of the present invention introduces both a main fluid stream (e.g., first fluid stream 370) and a waste fluid stream (e.g., second fluid stream 372) into the same relatively compact, dual-sided rotating impeller. This design further increases fluid flow by providing two individual fluid streams as compared to a single fluid supply being split between a main fluid stream (e.g., cold side) and waste side fluid stream (e.g., hot side). This increased fluid flow results in greater overall heat transfer. Compared to prior art designs, the construction techniques of fluid heat exchanger 10 eliminate many of the cost and reliability issues in addition to improved performance. It is noted that designating the cold side as the main stream and the hot side as the waste stream is not limiting. Depending on the preferred application, the hot side may be the main fluid stream.

Fluid heat exchanger 10 rotates on a shaft or shafts (not shown) connected to or extending through hub 30 and second hub 120 and driven by a motor or other prime mover. A brushless motor (not shown) may optionally be used with fluid heat exchanger 10 as necessary. It is anticipated that most applications will use a separate prime mover to simplify design.

A magnetic field is provided by pole pieces 402 disposed in housing 350. Magnetic flux can be supplied from small permanent magnets or through wound pole pieces where the flux strength is controlled by a variable field excitation current. In one embodiment, pole pieces 402 are disposed on or in flow divider panel 360, which is adjacent to perimeter rim 36 and second perimeter rim 136. In one embodiment, pole pieces 402 are disposed along an edge of divider opening 362 of flow divider panel 364. Pole pieces 402 are alternately disposed in housing 350 or outside of housing 350, depending on design parameters and constraints. For example, wire windings 400 may optionally be positioned on the impeller assembly 20 above the heat sinks 250. Additionally, wire windings 400 may be positioned in multiple positions on impeller assembly 20 to provide multiple sources of induced power. Wire windings 400 in impeller assembly 20, which is coupled to thermoelectric module through a rectifier 404 (not shown), are typically placed in gap 180 between outer ring 35 and/or second outer ring 114 and in close proximity to pole pieces 402. As wire winding 400 moves through the magnetic field, a current is induced in the conductor and power is supplied to thermoelectric module 200. The amount of current applied will depend on the number of windings, rotation speed and strength of the magnetic field.

Impeller assembly 20 may be made from a variety of materials that include plastics, conductive plastics, aluminum, steel or any other material suitable for the specific application. For high volume and lower cost, the preferred material, of first impeller body 22 and second impeller body 40 is injection-molded plastic. Other applications may benefit from material substitutions depending on fluid, performance, and cost considerations.

It is contemplated that the figuration of the number of impeller vanes and/or fins depends on the application. If the fluid heat exchanger 10 were configured to have the same number of impeller vanes on both sides of the impeller bodies, then the impeller vanes would push the same amount of air through both sides depending on downstream configuration. However, if one wanted the air as cool as much as possible and flow volume was not an issue, then a lesser number of vanes would be placed on the cold side of the fluid heat exchanger. The hot side would receive more airflow than the cooling side. The more cooling the hot side receives, the lower the temperature the cold side can achieve. The lower air flow across the cold side will allow more time for heat transfer and the cold air temperature will decrease.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. An integrated fluid heat exchanger comprising:
   an impeller assembly comprising:
      a first impeller body with a circular shape and having a first impeller perimeter rim and a plurality of first body openings therethrough;
      a second impeller body disposed parallel and coaxial to the first impeller body, the second impeller body having a circular shape and a second impeller perimeter rim connected to the first impeller perimeter rim and a plurality of second body openings therethrough that coincides with the plurality of first body openings of the first impeller body;
      a plurality of first impeller vanes extending transversely from the first impeller body and away from the second impeller body; and
      a plurality of second impeller vanes extending transversely from the second impeller body and away from the first impeller body;
   at least one thermoelectric module disposed between the first impeller body and the second impeller body, the at least one thermoelectric module having:
      a first substrate and a second substrate;
      a first heat sink connected to the first substrate and extending through the at least first opening; and
      a second heat sink connected to the second substrate and extending through the at least second opening; and
   a plurality of electrically-conductive windings disposed in the impeller assembly, the plurality of conductive windings configured to move through a magnetic field to thereby induce an electric current and to deliver the electric current to the at least one thermoelectric module;
   wherein the at least one thermoelectric module is positioned annularly between an outermost perimeter of the first impeller body and the second impeller body, and the plurality of first impeller vanes and the plurality of second impeller vanes.

2. The integrated fluid heat exchanger of claim 1 wherein the components thereof are integrated within a single housing, such that the at least one thermoelectric module, the plurality of first impeller vanes and the plurality of second impeller vanes are integrated in a single assembly capable of rotating about a hub.

3. The integrated fluid heat exchanger of claim 1 wherein the plurality of first body openings in the first impeller body are congruent and parallel to the plurality of second body openings in the second impeller body, the plurality of first body openings and the plurality of second body openings being arcuately arranged.

4. The integrated fluid heat exchanger of claim 1 further comprising a hub having an aperture which is congruent with an aperture extending through a center of the first impeller body and an aperture extending through a center of the second impeller body.

5. The integrated fluid heat exchanger of claim 1 further comprising a hub; and each of the first heat sink, the second heat sink, the plurality of first impeller vanes and the plurality of second impeller vanes are arcuately arranged so as to radiate away from the hub.

6. The integrated fluid heat exchanger of claim 1 wherein the plurality of second impeller vanes have a height that is at least a height of the second heat sink.

7. The integrated fluid heat exchanger of claim 1 wherein the plurality of first impeller vanes have a height that is at least a height of the first heat sink.

8. The integrated fluid heat exchanger of claim 1 wherein the plurality of second impeller vanes have a height that is less than a height of the second heat sink.

9. The integrated fluid heat exchanger of claim 1 wherein the plurality of first impeller vanes have a height that is less than a height of the first heat sink.

10. The integrated fluid heat exchanger of claim 1 wherein:
    the first impeller body further comprises a first planar outer surface, and a first inner region connected to a first outer ring by first bridge segments, the first bridge segments extend from the first inner region radially outward to the first outer ring; and
    the second impeller body further comprises a second planar outer surface, and a second inner region connected to a second outer ring by second bridge segments, the second bridge segments extend from the second inner region radially outward to the second outer ring.

11. The integrated fluid heat exchanger of claim 10 wherein:
    the first impeller body comprises the plurality of first body openings bounded by the first inner region, first bridge segments, and first outer ring;
    the second impeller body comprises the plurality of second body openings bounded by the second inner region, second bridge segments, and second outer ring;
    the first planer outer surface and the second planar outer surface are disposed axially opposed from one another; and
    the first inner region and the second inner region are congruent with one another, and the first bridge segments and the second bridge segments are congruent with one another, such that the plurality of first body openings are congruent with the plurality of second body openings.

12. The integrated fluid heat exchanger of claim 1 wherein
    the first impeller perimeter rim extends axially in a direction opposite of the first plurality of impeller vanes;
    the second impeller perimeter rim extends axially in a direction opposite of the second plurality of impeller vanes;
    the second impeller perimeter rim extends further than the first impeller perimeter rim such that a gap is defined between substantial portions of the first impeller body and the second impeller body; and
    the first impeller perimeter rim and the second impeller perimeter rim interlock with one another, thereby connecting the first impeller body and the second impeller body to one another.

13. The integrated fluid heat exchanger of claim 1 further comprising a housing, the housing having: a first side panel with a first side panel opening,
a second side panel with second side panel opening,
a flow divider panel with divider opening, and
a sidewall extending between and connecting each of the first side panel, the second side panel, and the flow divider panel.

* * * * *